United States Patent [19]
Hasegawa et al.

[11] Patent Number: 5,431,329
[45] Date of Patent: Jul. 11, 1995

[54] METHOD OF FORMING A BALL END FOR A SOLDER WIRE

[75] Inventors: Miki Hasegawa; Chojiro Kuriyama, both of Kyoto, Japan

[73] Assignee: Rohm Co., Ltd., Kyoto, Japan

[21] Appl. No.: 243,933

[22] Filed: May 17, 1994

[30] Foreign Application Priority Data

May 21, 1993 [JP] Japan .................. 5-119940

[51] Int. Cl.⁶ .......................... H01L 21/60
[52] U.S. Cl. .................. 228/180.5; 228/902
[58] Field of Search ............ 228/164, 180.5, 203, 228/219, 902, 4.5; 219/56.22

[56] References Cited

U.S. PATENT DOCUMENTS

| | | | |
|---|---|---|---|
| 4,020,543 | 3/1977 | Pennings | 228/4.5 |
| 4,674,671 | 6/1987 | Fister | 228/111 |
| 4,732,313 | 3/1988 | Kobayashi et al. | 228/4.5 |
| 5,170,928 | 12/1992 | Farassat | 228/4.5 |
| 5,295,619 | 3/1994 | Takahashi et al. | 228/180.5 |

FOREIGN PATENT DOCUMENTS

| | | |
|---|---|---|
| 169574 | 1/1986 | European Pat. Off. . |
| 265927 | 5/1988 | European Pat. Off. . |
| 2353100 | 5/1974 | Germany . |
| 2453112 | 11/1975 | Germany . |
| 4131413 | 10/1992 | Germany . |
| 4317131 | 11/1993 | Germany . |
| 55-118643 | 9/1980 | Japan . |
| 62-136835 | 6/1987 | Japan . |
| 63-40330 | 2/1988 | Japan . |

Primary Examiner—Samuel M. Heinrich
Attorney, Agent, or Firm—William H. Eilberg

[57] ABSTRACT

A method is provided for forming a ball at a lower end of a material solder wire which is arranged generally vertically. The method comprises the steps of: forming an upward stream of an oxygen-free gas surrounding the solder wire; bringing a lateral flame of combustion to a ball forming position adjacent to the upward gas stream but short of the solder wire to thermally melt the lower end of the solder wire into a ball; and causing the lower ball end of the solder wire to solidify in the upward gas stream.

7 Claims, 5 Drawing Sheets

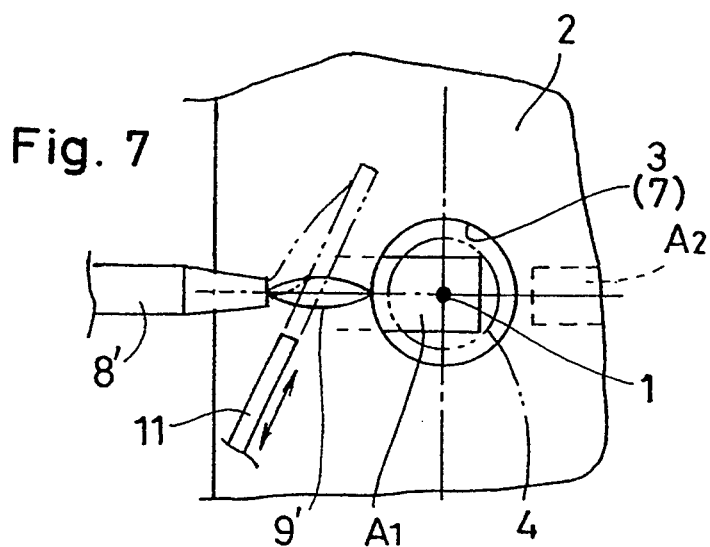
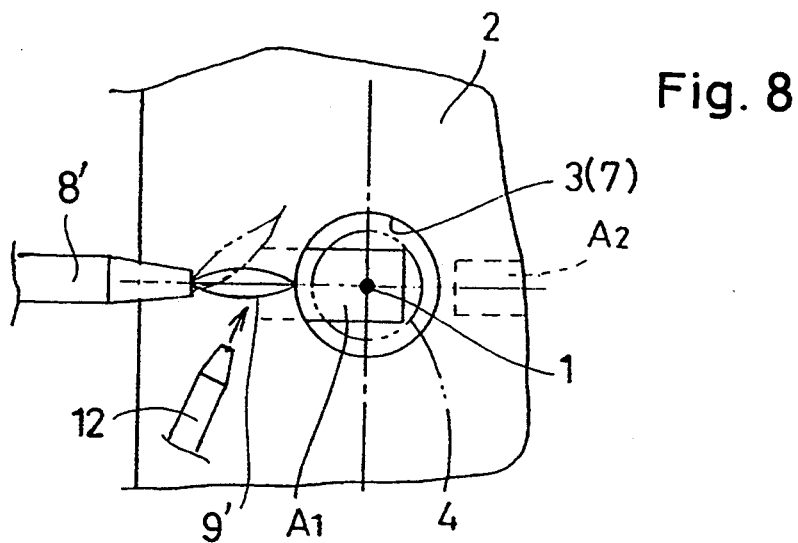
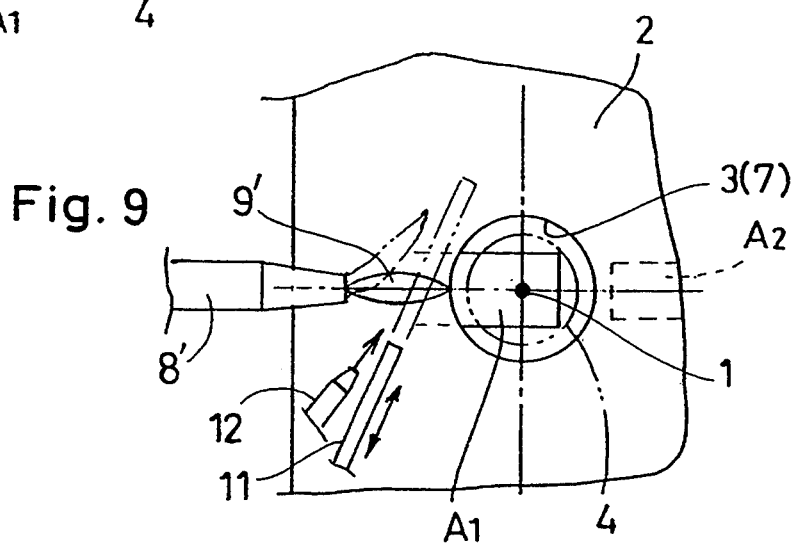

METHOD OF FORMING A BALL END FOR A SOLDER WIRE

BACKGROUND OF THE INVENTION

1. Field of the Invention

This invention relates to the wire bonding technology in general. More specifically, the present invention relates to a method of forming a ball at a lower end of a vertically arranged material solder wire for conveniently bonding to a workpiece such as a semiconductor chip and/or a leadframe.

2. Description of the Related Art

In electronic circuits or components, it is usually necessary to electrically connect between two different portions. For instance, a semiconductor chip need be electrically connected to a relevant lead of a leadframe through a metal wire.

In wire bonding, generally, a gold or silver wire is melted at both ends to form balls which are subsequently utilized for strong attachment to two different bonding portions. Such a wire bonding method, which is called "ball bonding", is possible because either gold or silver has a high melting point and is reluctantly oxidized.

If the melting point of a metal wire is low, it is difficult to control ball formation (with respect to the ball diameter for example) at the time of thermally cutting a material metal wire by a torch flame (formed by burning of hydrogen gas in the presence of oxygen for example). Further, if the metal wire is easily oxidized at the time of ball formation, the metal wire fails to provide a sufficiently strong and reliable connection to the relevant bonding portion.

On the other hand, it has been recently proposed to use a solder wire for wire bonding in place of a gold or silver wire, because solder is known to be less costly than either gold or silver. Further, a solder wire is also advantageous in that it can be made to have an additional function as a temperature fuse (or as a combined temperature/overcurrent fuse) since the melting point of solder is relatively low.

However, the low melting point (e.g. 296° C.) of solder makes it difficult to control ball formation at both ends of a solder wire. Particularly, when the solder wire is heated by a torch flame having a high temperature of about 2,000° C. for example, the lower end of the solder wire is melted too quickly in a large amount, so that the melted solder portion may likely to fall under gravity or otherwise deformed into an oblong form. Further, solder is known to be oxidized very easily at the time of melting. Thus, it has been believed impractical to applying the ball bonding method to the solder wire.

It is conceivable to form a ball at each a solder wire in an oxygen-free atmosphere in an attempt to prevent oxidation of the ball. However, since a torch flame is formed by combustion of a fuel gas (e.g. hydrogen) in the presence of excess oxygen, water vapor as a combustion product and/or excess oxygen inevitably oxidizes the ball end if the flame is made to directly act on the solder wire.

In a wire bonding method using a solder wire, therefore, two different methods are conventionally used for bonding the solder wire. A first method is the soldering method wherein a separate bonding solder layer is formed between each end of the solder wire and a relevant portion of a workpiece. A second method is the so-called "wedge bonding" method wherein each end of the solder wire is compressed by a bonding tool for flattening at the time of bonding to the workpiece.

However, the soldering method requires the use of solder in addition to the solder wire itself to result in a material waste. More importantly, the wire bonding process cannot be performed quickly and efficiently by the soldering method. Further, the soldering method cannot be applied when the interval between the bonding points is narrow.

On the other hand, the wedge bonding method has no problem of material waste and is applicable even when the interval between the bonding points is narrow. However, compared with the ball bonding method, there is a greater limitation in increasing the bonding area by flattening the wire end, so that it is difficult to obtain a sufficient bonding strength. Further, the flattened end portion of the wire is rather thin and easy to break, resulting in a quality deterioration of the products.

SUMMARY OF THE INVENTION

It is, therefore, an object of the present invention to provide a ball forming method by which the lower end of a vertically arranged material solder wire can be formed into a closely spherical ball with less likelihood of oxidation.

According to the present invention, there is provided a method of forming a ball at a lower end of a material solder wire which is arranged generally vertically, the method comprising the steps of: forming an upward stream of an oxygen-free gas along the solder wire, the solder wire being arranged in the upward gas stream; bringing a combustion flame of a torch to a ball forming position adjacent to the upward gas stream but short of the solder wire to thermally melt the lower end of the solder wire into a ball; and causing the lower ball end of the solder wire to solidify in the upward gas stream.

According to one embodiment of the present invention, the flame may be rendered movable toward and away from the upward gas stream by pivoting the torch about a vertical axis.

According to another embodiment of the present invention, the torch may be held in a fixed position for directing the flame, in natural state, to the ball forming position. In this case, however, the flame is deflected away from the upward gas stream by bringing a movable deflector plate to a position between the torch and the upward gas stream when the lower ball end of the solder wire is solidified. Alternatively or additionally, the flame is deflected away from the upward gas stream by discharging a deflecting gas jet toward the flame when the lower ball end of the solder wire is solidified.

Preferably, the upward gas stream may be preheated to a temperature lower than a melting point of the solder wire. Further, it is also preferable that the flame be kept outside the upward gas stream at the ball forming position. Moreover, the flame in the ball forming position may be advantageously made to thermally cut the material solder wire for separating a solder wire segment which is also made to have a ball end at a point of separation.

Other objects, features and advantages of the present invention will become apparent from the following detailed description of preferred embodiments given with reference to the accompanying drawings.

BRIEF DESCRIPTION OF THE DRAWINGS

In the accompanying drawings:

FIG. 7 is a plan view showing an apparatus used for performing a ball forming method according to a second embodiment the present invention;

FIG. 8 is a plan view showing an apparatus used for performing a ball forming method according to a third embodiment the present invention; and FIG. 9 is a plan view showing an apparatus used for performing a ball forming method according to a fourth embodiment the present invention.

DETAILED DESCRIPTION OF PREFERRED EMBODIMENT

Figure 1:
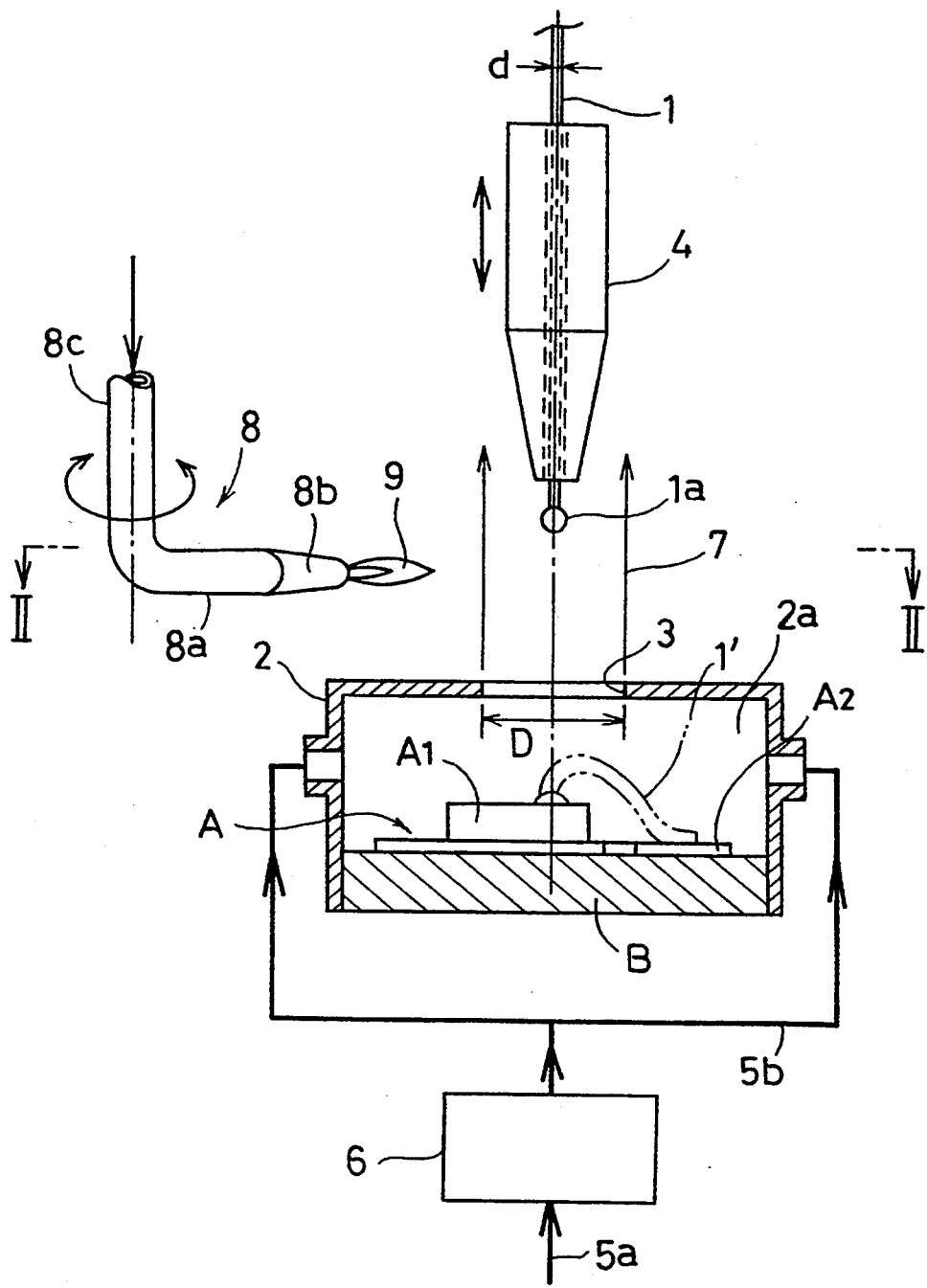
FIG. 1 is a front view, partly in vertical section, showing an apparatus used for performing a ball forming method according to a first embodiment the present invention.

Referring first to FIG. 1 of the accompanying drawings, there is illustrated a leadframe A placed on a support block B which may additionally have a heating function. The leadframe A carries a semiconductor chip A1 and has a lead A2 associated therewith. A ball forming method according to a first embodiment of the present invention may used to electrically connect between the semiconductor chip A1 and the associated lead A2 via a solder wire segment 1'.

It should be appreciated that the leadframe A actually carries a plurality of semiconductor chips and a plurality of leads. For simplicity, however, the description of the ball forming or wire bonding method is made only with respect to the single semiconductor chip A1 and its associated lead A2.

A cover member 2 is mounted to the support block B to define a tunnel 2a for allowing movement of the leadframe A. The cover member 2 has an opening 3 of a suitable diameter D immediately above the semiconductor chip A.

A capillary tool 4 is arranged immediately above the opening 3. The capillary tool 4 holds a material solder wire 1 of a diameter d passed therethrough. The capillary tool 4 is vertically movable into and out of the tunnel 2a through the opening 3. The material solder wire 1 may be made of a Pb-Sn alloy for example.

The tunnel 2a defined by the combination of the cover member 2 and the support block B communicates with a source (not shown) of an oxygen-free gas through a main supply line 5a and branch lines 5b. The main supply line 5a is provided with a preheater 6 for heating the oxygen-free gas to a temperature (about 150°–200° C. for example) which is lower than the melting point (e.g. 296° C.) of the material solder wire 1.

The oxygen-free gas may be an inert gas such as nitrogen gas or argon gas. Alternatively, the oxygen-free gas may be a reducing gas containing nitrogen gas mixed with about 4–5% of hydrogen gas for example. During the wire bonding operation (ball forming operation), the material solder wire 1 is held in an upward stream 7 of oxygen-free gas which is continuously formed through the opening 3 of the cover member 2.

The capillary tool 4 is flanked by an L-shaped torch 8 which includes a horizontal pipe portion 8a with a nozzle tip 8b, and a vertical pipe portion 8c extending perpendicularly to the horizontal pipe portion 8a. The nozzle tip 8b forms a flame 9 in a direction substantially perpendicular to the material solder wire 1. The flame 9 may be typically formed by burning a mixture of hydrogen and oxygen for example.

Figure 2:
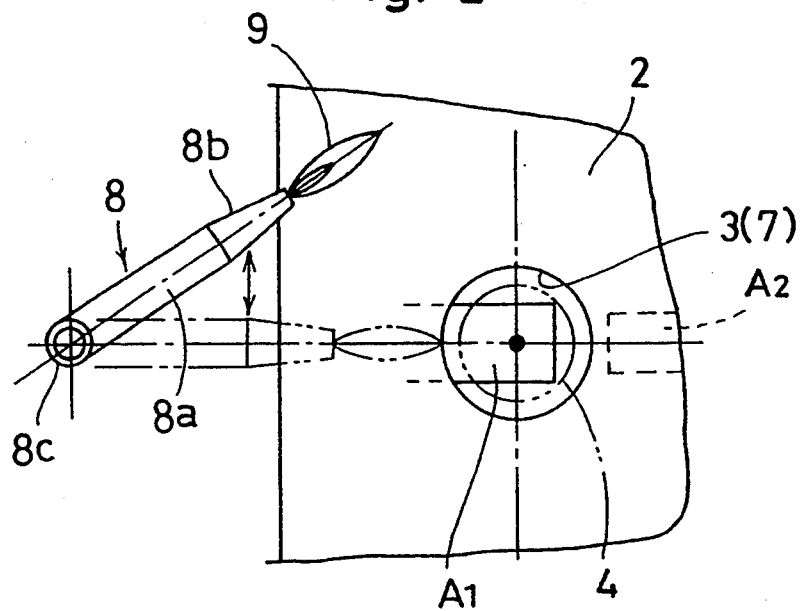
FIG. 2 is a plan view of the same apparatus as seen in the direction of arrows II—II in FIG. 1.

As shown in FIG. 2, the torch 8 is pivotable about the vertical pipe portion 8c thereof to assume different pivotal positions which include a first position (indicated by the solid lines in FIG. 2) for the flame 9 of the torch 8 is located away from the oxygen-free gas stream 7, and a second position (indicated by chain lines in FIG. 2) wherein the flame 9 is directed toward and located adjacent to the oxygen-free gas stream 7 without entering thereinto.

With the wire bonding apparatus (ball forming apparatus), the following method steps are performed for electrically connecting between the semiconductor chip A1 and the lead A2. It should be appreciated that the oxygen-free gas stream 7 is always formed throughout the method steps.

Figure 3:
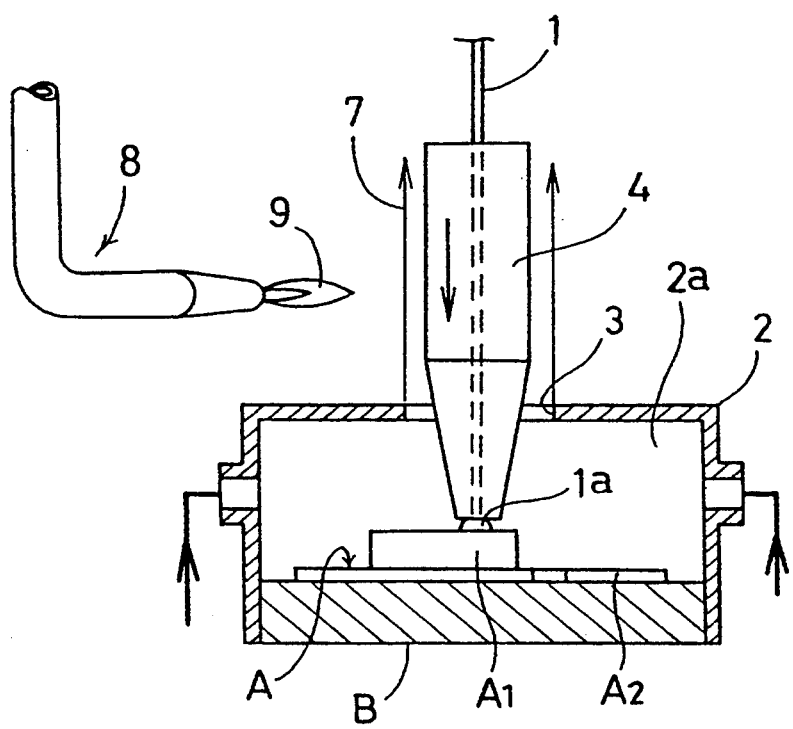
FIG. 3 is a view similar to FIG. 1 but showing the same apparatus in its state for performing a first bonding step.

First, as shown in FIG. 3, the lower end 1a of the material solder wire 1, which has been previously formed into a ball (see FIG. 1), is bonded to the semiconductor chip A1 by lowering the capillary tool 4 for pressing the ball end 1a to the chip under application of heat (provided by the preheated oxygen-free gas and the heating function of the support block B) and/or ultrasonic vibration. As a result, the wire ball end 1a is deformed to have a nail head shape. At this time, the torch 8 is pivoted to the first position (the solid line position in FIG. 2) to bring the torch flame 9 away from the oxygen-free gas stream 7.

Figure 4:
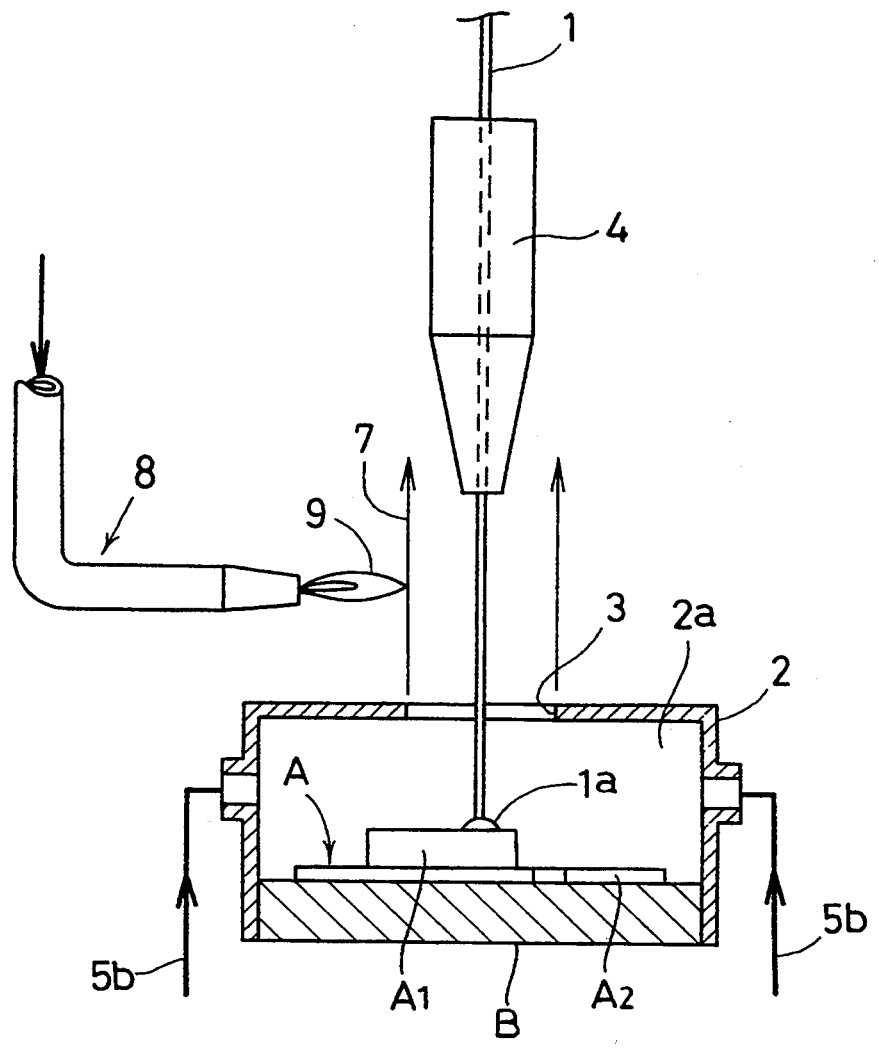
FIG. 4 is a view also similar to FIG. 1 but showing the same apparatus at the time of starting a ball forming step.

Then, as shown in FIG. 4, the capillary tool 4 is raised while allowing the material solder wire 1 to be paid out. The raising of the capillary tool 4 is stopped when the material solder wire 1 is paid out by a predetermined amount.

Figure 5:
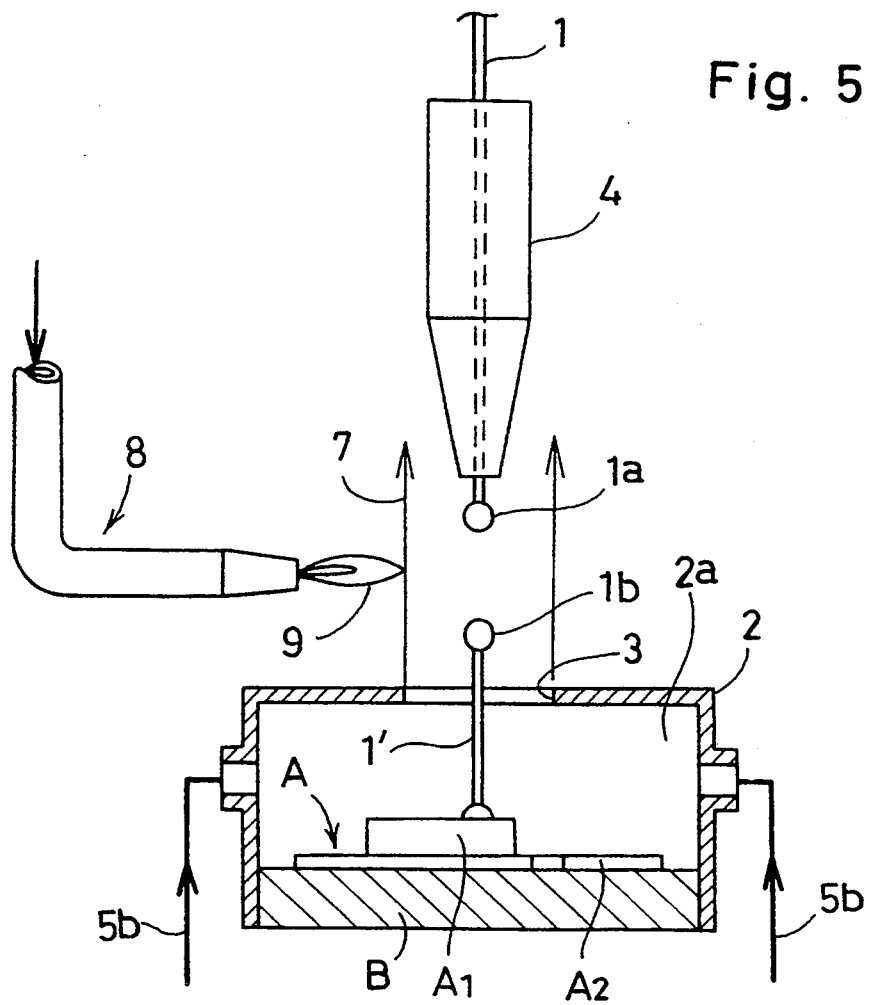
FIG. 5 is a view again similar to FIG. 1 but showing the same apparatus immediately after finishing the ball forming step.

Then, as shown in FIG. 5, the torch 8 is pivoted to the second position (the chain line position in FIG. 2) wherein the torch flame 9 is directed toward and located adjacent to the oxygen-free stream 7. As a result, the material solder wire 1 is thermally cut by heat radiation from the torch flame 9 to provide a shorter wire segment 1' connected at the nail head end 1a to the semiconductor chip A1. Further, the separated wire segment 1' is made to have an upper ball end 1b which is formed by the surface tension of the melted solder portion under gravity. It should be appreciated that the pivoting of the torch 8 to the second position may be performed synchronously with the raising of the capillary tool 4 (see FIG. 4).

As also shown in FIG. 5, on the other hand, the heat of the torch flame 9 is carried up by the upward stream 7 of the oxygen-free gas to cause melting at the new lower end 1a of the material solder wire 1. At this time, the upward gas stream 7 tends to provide a lifting force which prevents the melted new lower end 1a of the material solder wire 1 from gravitationally falling and/or deforming into an oblong form. As a result, the lower end 1a of the material solder wire 1 is formed into a closely spherical ball due to surface tension.

Then, the torch 8 is pivotally returned to the first position (the solid line position in FIG. 2) to bring the torch flame 9 away from the oxygen-free gas stream 7. In this condition, the gas stream 7 serves as a cooling gas for solidifying the new lower ball end 1a of the material solder wire 1 and the upper ball end 1b of the solder wire segment 1'.

Figure 6:
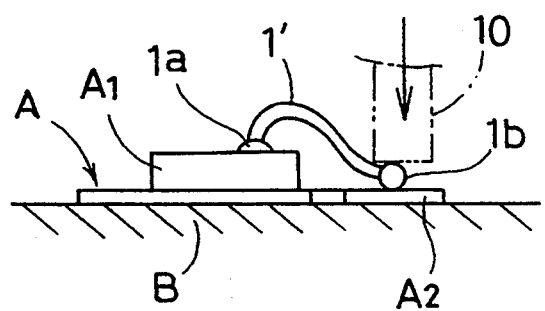
FIG. 6 is a view showing the same apparatus in its state for performing a second bonding step.

Finally, as shown in FIG. 6, a bonding tool 10 is operated to bend the solder wire segment 1' and press its upper ball end 1b against the lead A2 of the leadframe A for bonding thereto. In this way, electrical connection between the semiconductor chip A1 and the lead A2 is established by the solder wire segment 1'.

Obviously, the new lower ball end 1a of the material solder wire 1 is used for bonding to another semiconductor chip (not shown) by repeating the above method steps (see FIGS. 3 and 4).

According to the wire bonding method (the ball forming method) described above, the upward gas stream 7 provides an oxygen-free atmosphere, and the torch flame 9 does not directly act on (touch) the material solder wire 1 at the time of forming the ball ends 1a, 1b. Thus, even if the torch flame 9 contains water vapor (as a burning reaction product) and excess oxygen, the surfaces of the ball ends 1a, 1b can be reliably prevented from formation of an oxide layer which would result in improper wire bonding.

According to the first embodiment, when the torch 8 is pivoted to the second position (the chain line position in FIG. 2), the torch flame 9 is still kept out of the oxygen-free gas stream 7, as shown in FIGS. 4 and 5. Therefore, it is possible to prevent the water vapor content and excess oxygen of the flame 9 from being carried by the gas stream 7, so that the ball ends 1a, 1b are more reliably prevented from being oxidized. However, as long as the torch flame 9 does not directly act on (touch) the material solder wire 1, the flame 9 may slightly enter into the gas stream 7.

According to the first embodiment, further, the preheater 6 heats the oxygen-free gas to a temperature (e.g. 150°–200° C.) which is lower than the melting point (e.g. 296° C.) of the material solder wire 1. Such an arrangement is preferable because the preheater 6 supplies additional heat for enabling the torch flame 9 to thermally cut the material solder wire 1 and form the ball ends 1a, 1b even if the flame 9 does not enter the gas stream 7.

According to the first embodiment, the torch flame 9 is used to thermally cut the material solder wire 1 while also forming the balls 1a, 1b at the new lower end of the material solder wire 1 and the upper end of the separated solder wire segment 1'. However, the torch flame 9 may be used only for forming a ball at the lower end of the material solder wire 1.

FIG. 7 shows a second embodiment which differs from the first embodiment only in that a torch 8' is always held stationary, and a torch flame 9' is directed away from the oxygen-free gas stream 7 by a deflector plate 11 which is movable between a deflecting position (indicated by chain lines) and a non-deflecting position (indicated by solid lines). Preferably, the deflector plate 11 may be made of a heat-resistant insulating material such as ceramic.

According to the second embodiment, when the deflector plate 11 is advanced to the deflecting position, the torch flame 9' is brought away from the oxygen-free gas stream 7 to prevent thermal melting of the solder wire 1 due to an increase of distance from the solder wire and a heat shielding effect provided by the deflector plate 11. Conversely, when the deflector plate 11 is retreated to the non-deflecting position, the torch flame 9' is brought close to the oxygen-free gas stream 7 for thermally melting the solder wire 1 for oxidation-free ball formation by heat radiation.

FIG. 8 shows a third embodiment wherein the deflector plate 11 of the second embodiment is replaced by a deflecting gas jet nozzle 12 for deflecting the torch flame 9' away from the oxygen-free gas stream 7. The gas jet nozzle 12 may be made to discharge air or oxygen-free gas.

According to the third embodiment, when the nozzle 12 operates to generate a gas jet toward the torch flame 9', the flame 9' is deflected away from the oxygen-free gas stream 7 to prevent thermal melting of the solder wire 1 due to an increase of distance from the solder wire and a cooling effect provided by the gas jet. Conversely, when the nozzle 12 stops generating a gas jet, the torch flame 9' is brought close to the oxygen-free gas stream 7 for thermally melting the solder wire 1 for oxidation-free ball formation by heat radiation.

FIG. 9 shows a fourth embodiment which corresponds to a combination of the second and third embodiments (FIGS. 7 and 8) described above. Specifically, according to this embodiment, use is made of a deflector plate 11 and a deflecting gas jet nozzle 12 for deflecting the torch flame 9' away from the oxygen-free gas stream 7.

Apparently, the third embodiment is advantageous in that the intended deflection of the torch flame 9' is reliably performed. Further, the third embodiment is also advantageous in that the gas jet from the nozzle 12 cools the deflector plate 11 which may be considerably heated by the torch flame 9', thereby preventing the possibility that the solder wire 1 is accidentally melted by the heat radiation from the heated deflector plate 11 itself.

The preferred embodiments of the present invention being thus described, it is obvious that the same may be varied in many ways. For instance, the wire bonding method (ball forming method) may be applied for electrically connecting between a semiconductor chip and a wiring conductor pattern of a printed circuit board. Such variations are not to be regarded as a departure from the spirit and scope of the the invention, and all such modifications as would be obvious to those skilled in the art are intended to be included within the scope of the following claims.

We claim:

1. A method of forming a ball at a lower end of a material solder wire which is arranged generally vertically, the method comprising the steps of:

forming an upward stream of an oxygen-free gas along the solder wire, the solder wire being arranged in the upward gas stream;

bringing a combustion flame of a torch to a ball forming position adjacent to and outside the upward gas stream to thermally melt the lower end of the solder wire into a ball; and causing the lower ball end of the solder wire to solidify in the upward gas stream.

2. The method according to claim 1, wherein the flame is movable toward and away from the upward gas stream by pivoting the torch about a vertical axis.

3. The method according to claim 1, wherein the torch is held in a fixed position for directing the flame, in natural state, to the ball forming position, the flame being deflected away from the upward gas stream by bringing a movable deflector plate to a position between the torch and the upward gas stream when the lower ball end of the solder wire is solidified.

4. The method according to claim 1, wherein the torch is held in a fixed position for directing the flame, in natural state, to the ball forming position, the flame being deflected away from the upward gas stream by discharging a deflecting gas jet toward the flame when the lower ball end of the solder wire is solidified.

5. The method according to claim 1, wherein the torch is held in a fixed position for directing the flame, in natural state, to the ball forming position, the flame being deflected away from the upward gas stream by bringing a movable deflector plate to a position between the torch and the upward gas stream as well as by discharging a deflecting gas jet toward the flame when the lower ball end of the solder wire is solidified.

6. The method according to claim 1, wherein the upward gas stream is preheated to a temperature lower than a melting point of the solder wire.

7. The method according to claim 1, wherein the flame in the ball forming position is made to thermally cut the material solder wire for separating a solder wire segment which is also made to have a ball end at a point of separation.

* * * * *